United States Patent [19]
Mallary et al.

[11] Patent Number: 4,828,966
[45] Date of Patent: May 9, 1989

[54] METHOD FOR PRODUCING HALL EFFECT SENSOR FOR MAGNETIC RECORDING HEAD

[75] Inventors: Michael Mallary, Berlin; Christine Bisagni, Framingham; Shu-Huei Liu, Shrewsbury, all of Mass.

[73] Assignee: Digital Equipment Corporation, Maynard, Mass.

[21] Appl. No.: 128,947

[22] Filed: Dec. 4, 1987

[51] Int. Cl.⁴ ................................................. G03C 5/00
[52] U.S. Cl. ..................................... 430/314; 430/311; 430/315; 430/317; 360/112
[58] Field of Search ........................... 360/112; 29/603; 430/311, 313, 314, 317, 315; 156/643

[56] References Cited

U.S. PATENT DOCUMENTS

| | | | |
|---|---|---|---|
| 3,605,258 | 9/1971 | Fisher et al. | 29/603 |
| 4,392,167 | 7/1983 | Joormann | 360/120 |
| 4,406,722 | 9/1983 | Chew et al. | 156/89 |
| 4,577,250 | 3/1986 | Sato et al. | 360/112 |
| 4,587,509 | 5/1986 | Pitt et al. | 338/32 H |

Primary Examiner—José G. Dees
Attorney, Agent, or Firm—Finnegan, Henderson, Farabow, Garrett, & Dunner

[57] ABSTRACT

A method of forming a Hall effect sensor for a magnetic recording head including the steps of providing a single crystal substrate having a chemically dissimilar single crystal film thereon, providing a ceramic substrate having a first magnetic pole piece of a selected thickness formed on a surface thereof, positioning the single crystal substrate and the ceramic substrate with the single crystal film and magnetic pole piece surfaces in an opposing relationship, bonding the positioned ceramic substrate to the single crystal film on the positioned single crystal substrate to form a laminated structure having a substantially thin uniform bond line, removing chemically the single crystal substrate from the single crystal film, forming a Hall effect pattern in the film while one surface of the film is exposed, and depositing a second magnetic pole piece on the formed Hall effect pattern.

10 Claims, 3 Drawing Sheets

METHOD FOR PRODUCING HALL EFFECT SENSOR FOR MAGNETIC RECORDING HEAD

FIELD OF THE INVENTION

The present invention relates to a magnetic recording device and, more particularly, to a method of forming a Hall effect sensor for a magnetic recording head.

BACKGROUND OF THE INVENTION

Magnetic recording heads are used in computers, tape recorders, video tape recorders, and the like to store data on a magnetic tape or disk and to read such data from such a tape or disk. Magnetic sensors are used in such magnetic recording heads to detect the signal applied to the magnetic recording head by the recording medium.

Magnetic sensors widely used include thin film inductive sensors, magnetoresistance (MR) sensors, and Hall effect sensors. Of these sensors, Hall effect sensors are desirable because of their ability to detect weaker signals. Accordingly, magnetic recording heads incorporating a Hall effect sensor are suitable for use in higher density recording systems.

To efficiently use the magnetic flux during the read back process from a magnetic recording device, the dead (nonmagnetic) layers in a Hall effect sensor, such as the insulating and bonding layers, should be thin. Further, to reduce the noise resulting from electron scattering between grain boundaries and to obtain stronger signals, the Hall effect element should be a thin (on the order of a few microns), single crystal film of a semiconductor material.

Accordingly, it is an object of the invention to provide a method for producing a Hall effect sensor that overcomes the difficulties and disadvantages of the prior art.

It is a further object of the invention to provide a method of forming a Hall effect sensor having thin, readily reproducible bond lines wherein the Hall effect element is a thin, single crystal film of a semiconductor material.

Additional objects and advantages will be set forth in the description which follows, and in part, will be obvious from the description, or may be learned by practice of the invention.

SUMMARY OF THE INVENTION

To achieve the foregoing objects and in accordance with the purpose of the invention, as embodied and broadly described herein, a method is provided in the present invention for forming a Hall effect sensor for a magnetic recording head. In the method a single crystal substrate having a chemically dissimilar single crystal film thereon is provided. A ceramic substrate having a first magnetic pole piece of a selected thickness formed on a surface thereof is also provided. The single crystal substrate and the ceramic substrate are positioned with the single crystal film and magnetic pole piece surfaces in an opposing relationship. Subsequently, the positioned ceramic substrate is bonded to the single crystal film on the positioned single crystal substrate to form a laminated structure having a substantially uniform thin bond line. The single crystal substrate is then removed chemically from the single crystal film. A Hall effect pattern is formed in the film while one surface of the film is exposed. A second magnetic pole piece is then deposited on the formed Hall effect pattern.

In one aspect of the present invention, the step of providing the ceramic substrate comprises the substep of forming a patterned magnetic pole piece on the surface of the ceramic substrate, and the step of forming the Hall effect pattern is performed after the step of removing the single crystal substrate from the single crystal film.

In another aspect of the present invention, the step of forming the Hall effect pattern is performed prior to the step of bonding the positioned ceramic substrate to the single crystal film on the positioned single crystal substrate.

The accompanying drawings, which are incorporated in and constitute a part of this specification, illustrate several exemplary embodiments of the invention and together with the description, serve to explain the principles of the invention.

DESCRIPTION OF THE PREFERRED EMBODIMENTS

Reference will now be made in detail to the present preferred embodiments of the invention, examples of which are illustrated in the accompanying drawings.

Figure 1:
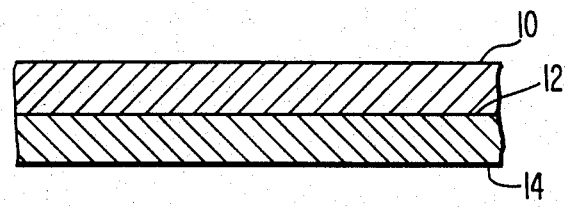
FIG. 1 is a schematic view of a single crystal film formed on the surface of a single crystal substrate.

In accordance with the method of forming a Hall effect sensor of the invention, there is provided a single crystal substrate having a chemically dissimilar single crystal film thereon. As embodied herein and referring to FIG. 1, single crystal film 10 deposited onto surface 12 of single crystal substrate 14 using known epitaxial deposition techniques, such as molecular beam epitaxy (MBE), metal organic chemical vapor deposition (MOCVD), and liquid phase epitaxy (LPE). Preferably, the thickness of single crystal film 10 is selected to optimize the performance of the device and, accordingly, depends upon the specific application thereof. The film 10 and substrate 14 are formed from chemically dissimilar materials so that substrate 14 can be removed from film 10 using a selective chemical etchant that will not significantly dissolve film 10.

The step of providing the single crystal substrate preferably includes the substep of depositing a single crystal film on a single crystal substrate, wherein the single crystal substrate is soluble in a selected chemical and the single crystal film is substantially insoluble in the same selected chemical. By way of example, the single crystal film may be InSb and the single crystal substrate may be InP or AlGaAs/GaAs. When the single crystal film is InSb and the single crystal substrate is InP, InP may be etched away using concentrated hydrochloric acid InSb is substantially insoluble in concentrated hydrochloric acid.

When the single crystal film is InSb and the single crystal substrate is AlGaAs/GaAs, GaAs may be etched away using a suitable etchant such as a solution of ammonium hydroxide and hydrogen peroxide. AlGaAs serves as an etch stop when the GaAs is etched away. Those skilled in the art will recognize other suitable chemically dissimilar materials for practicing the method of the invention.

Figure 2:
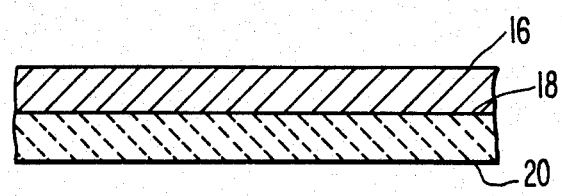
FIG. 2 is a schematic view of a magnetic pole piece on the surface of a ceramic substrate.

In accordance with the invention, there is provided a ceramic substrate having a first magnetic pole piece of a selected thickness formed on a surface thereof. Referring to FIG. 2, and as embodied herein, magnetic layer 16 is formed on surface 18 of ceramic substrate 20. Suitable materials for magnetic layer 16 include NiFe and other comparable ferromagnetic materials. A suitable material for ceramic substrate 20 is, for example, ALSIMAG ®, a composite ceramic of TiC and $Al_2O_3$ available from the 3M Company of Minneapolis, Minn. Other suitable materials for ceramic substrate 20 include calcium titanate, glass, photoceram, NiZn ferrite, or MnZn ferrite, which may be obtained from either the 3M Company of Minneapolis, Minn. or Sumitomo Special Metals Co., Ltd. of Japan.

Figure 3:
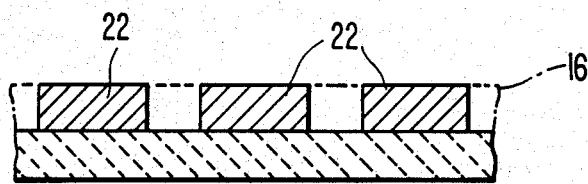
FIG. 3 is a schematic view of the structure shown in FIG. 2 after the magnetic pole piece has been patterned for carrying out the method according to a first preferred embodiment of the invention.
Figure 4:
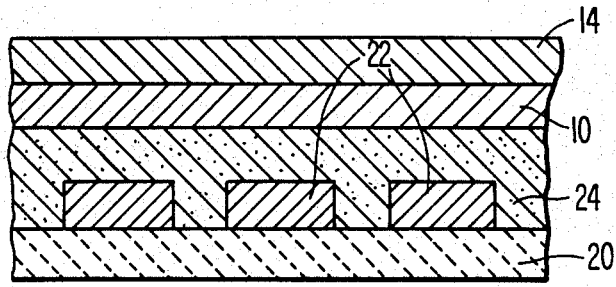
FIG. 4 is a schematic view of the single crystal substrate and the ceramic substrate positioned with the single crystal film and magnetic pole piece surfaces in an opposing relationship according to the first preferred embodiment of the invention.

In accordance with the invention, the single crystal substrate and the ceramic substrate are positioned with the single crystal film and magnetic pole piece surfaces in an opposing relationship. Referring to FIG. 4, and as embodied herein, substrate 14 having film 10 thereon is positioned with ceramic substrate 20 having magnetic layer 16 thereon in which pattern 22 has been formed as shown in FIG. 3. Pole piece 22 may be formed by sheet deposition of layer 16 followed by patterned etching or by mask plating. In the case of a ferromagnetic ceramic substrate, pole piece 22 is formed by patterned etching of substrate 20 itself. The surface of film 10 and the surface of patterned magnetic pole piece 22 are in an opposing relationship. As shown in FIG. 4, adhesive material 24 is sandwiched between the substrates. The structure shown in FIG. 4, however, is prior to the step of squeezing the substrates together to remove excess adhesive material 24 in accordance with a feature of the invention to be described hereinafter.

In accordance with the invention, the positioned ceramic substrate is bonded to the single crystal film on the positioned single crystal substrate to form a laminated structure having a very thin, uniform bond line. As embodied herein, this step of bonding the positioned ceramic substrate to the single crystal film on the single crystal substrate comprises the substeps of applying an adhesive layer to one of the respective surfaces having the patterned magnetic pole piece and the single crystal film, squeezing the positioned substrates together with a force sufficient to remove excess adhesive between the opposing surfaces for forming a bond line of adhesive, and curing the adhesive for bonding the positioned substrates. The patterned magnetic pole pieces form a plurality of grooves or channels which permits any excess adhesive to flow away during the bonding process.

Figure 5:
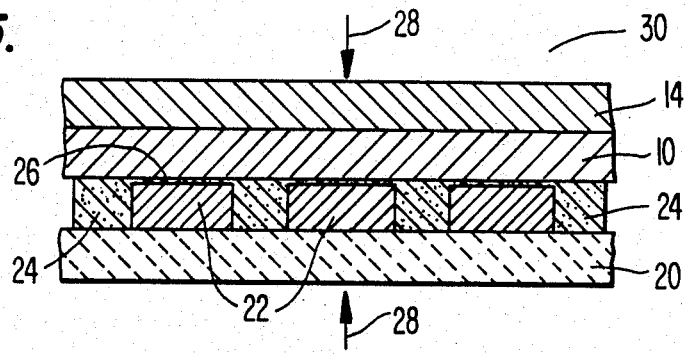
FIG. 5 is a schematic view of the structure shown in FIG. 4 after the positioned substrates have been squeezed together.

Referring to FIG. 5, and as embodied herein, adhesive material 24 is provided on one of the opposing surfaces of the substrates to form laminated structure 30. Adhesive material 24 is preferably an epoxy. However, other adhesive materials, including but not limited to, low viscosity organic materials, low melting point glasses, low melting point metals, and low melting point alloys, for example, may also be used. If desired, intermediate adhesion layers (not shown) may be provided.

Pressure is applied to laminated structure 30 in the direction of arrows 28 to squeeze excess adhesive material 24 out of the formed channels and the space created due to the selected thickness of patterned magnetic pole piece 22. By way of example, pressure may be applied to laminated structure 30 by placing it under a suitable load of weights during curing of the particular adhesive material employed. Squeezing excess adhesive material 24 out of laminated structure 30 in this manner yields thin bond line 26 between film 10 and patterned magnetic pole piece 22. Subsequently, adhesive material 24 is cured for bonding the positioned substrates. As used herein, the term "curing" includes the solidification of low melting point glasses, metals, and alloys for bonding when these particular adhesives are employed.

Figure 6:
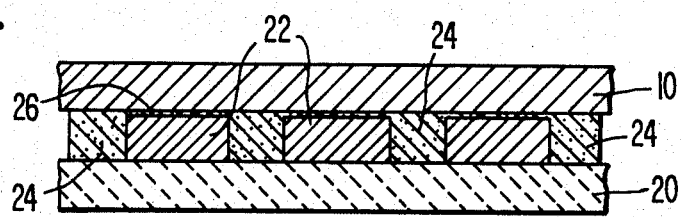
FIG. 6 is a schematic view of the structure shown in FIG. 5 after the single crystal substrate has been removed.

In accordance with the invention, the single crystal substrate is chemically removed from the single crystal film. Referring to FIG. 6, and as embodied herein, substrate 14 is removed to expose film 10. Preferably, this removal step includes the substep of etching the single crystal substrate away with a selective etchant effective to dissolve the substrate without significantly dissolving the single crystal film. By way of example, when film 10 is comprised of InSb and substrate 14 is comprised of InP, concentrated hydrochloric acid removes substrate 14 by dissolving it away without significantly dissolving film 10.

Figure 7:
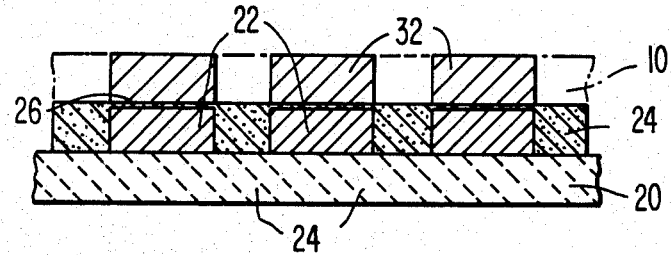
FIG. 7 is a schematic view of the structure shown in FIG. 6 after a Hall effect pattern has been formed in the single crystal film according to the first preferred embodiment of the invention.

A Hall effect pattern is formed in accordance with the invention in the single crystal film while one surface of the film is exposed. Referring to FIG. 7, and as embodied herein, the step of providing the substrate 20 includes the substep of forming patterned magnetic pole piece 22 on surface 18 of substrate 20, and Hall effect pattern 32 is formed in film 10 after substrate 14 has been removed from film 10 as shown in FIG. 6. Preferably, patterned magnetic pole piece 22 is formed by plating with a photoresist pattern. If patterned magnetic pole piece 22 is conductive, a thin insulation layer (not shown) may be formed thereon.

Figure 9:
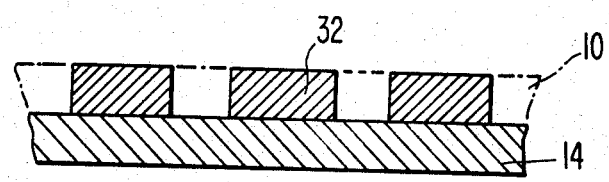
FIG. 9 is a schematic view of the structure shown in FIG. 1 after a Hall effect pattern has been formed in the single crystal film for carrying out the method according to a second preferred embodiment of the invention.

In an alternative embodiment of the invention, Hall effect pattern 32 may be formed in film 10 prior to the step of bonding positioned substrate 20 to film 10 on positioned substrate 14 while film 10 is exposed as shown in FIG. 9. When a low melting point metal or alloy adhesive material is used, a thin electrical insulating film (not shown) should be deposited on Hall effect pattern 32 prior to bonding. Preferably, the Hall effect pattern 32 is formed by ion milling with a photoresist pattern. If desired, the surface of film 10 may be patterned and ion milled again to remove excess adhesive material 24 from around patterned magnetic pole piece 22. With this method, ceramic substrate 20 may be magnetic (e.g., ferrite). The ferrite itself is not patterned in order to provide the thin bond line.

Figure 8:
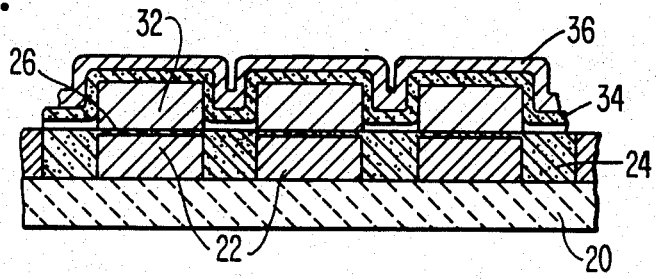
FIG. 8 is a schematic view of the structure shown in FIG. 7 after an insulation layer and a second magnetic pole piece has been deposited on the formed Hall effect pattern.

In accordance with the invention, a second magnetic pole piece is deposited on the formed Hall effect pattern. Referring to FIG. 8, and as embodied herein, magnetic pole piece 36 may be deposited using conventional deposition techniques. If necessary, insulation layer 34 may be provided between magnetic pole piece 36 and Hall effect pattern 32. Subsequently, the recording head may be completed using well-known conventional thin film head processing techniques. The precise sequence of steps to complete the recording head varies depending upon whether a two-pole or three-pole head is to be formed.

Figure 10:
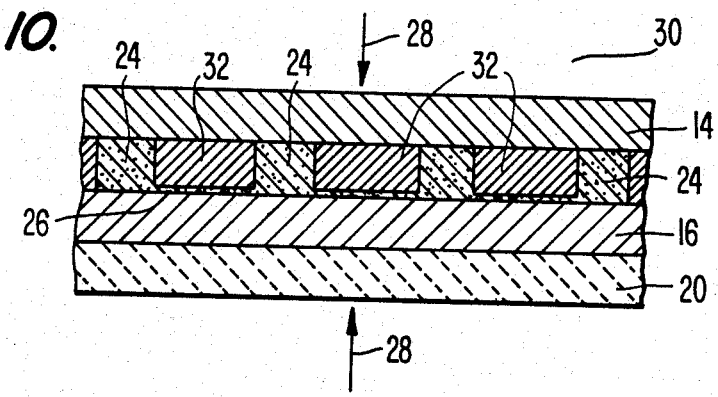
FIG. 10 is a schematic view of the single crystal substrate and the ceramic substrate positioned with the single crystal film and magnetic pole piece surfaces in an opposing relationship according to the second preferred embodiment of the invention after the positioned substrates have been squeezed together.
Figure 11:
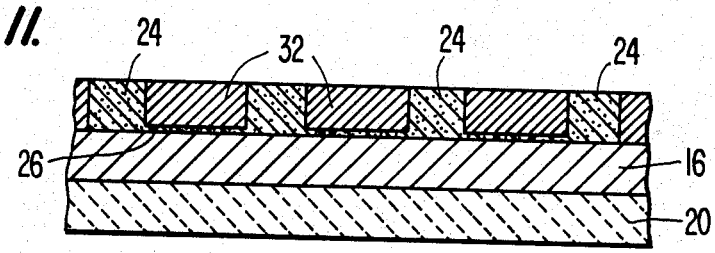
FIG. 11 is a schematic view of the structure shown in FIG. 10 after the single crystal substrate has been removed.
Figure 12:
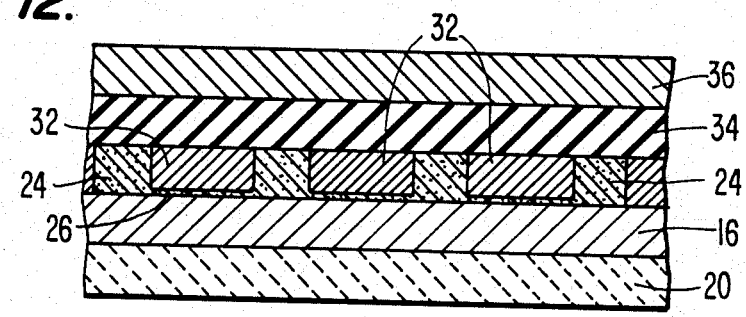
FIG. 12 is a schematic view of the structure shown in FIG. 11 after excess adhesive has been removed and an insulation layer and a second magnetic pole piece have been deposited on the formed Hall effect pattern.

FIGS. 10–12 further depict the method according to the alternative embodiment of the present invention. Referring to FIG. 10, and as embodied herein, substrate 20 having magnetic pole piece 16 thereon is positioned with substrate 14 having film 10 thereon in which Hall effect pattern 32 has been formed. The surface of magnetic pole piece 16 and the surface of Hall effect pattern 32 are in an opposing relationship. Adhesive material 24 is provided between the positioned substrates to form laminated structure 30. Pressure is applied to laminated structure 30 in the direction of arrows 28 to squeeze excess adhesive material 24 out of the channels and the space created due to the thickness of Hall effect pattern 32. Squeezing the positioned substrates in this manner yields thin bond line 26 between magnetic pole piece 16 and Hall effect pattern 32 formed in film 10.

Referring to FIG. 11, and as embodied herein, substrate 14 is chemically removed to expose Hall effect pattern 32 formed in film 10. Subsequently, as embodied herein and shown in FIG. 12, magnetic pole piece 36 is deposited on Hall effect pattern 32. If necessary, insulation layer 34 may be provided between magnetic pole piece 36 and Hall effect pattern 32 to prevent electrical shorts and to form a recording head gap between the poles.

It will be apparent to those skilled in the art that various modifications and variations can be made in the method of forming a Hall effect sensor for a magnetic recording head of the present invention without departing from the scope or spirit of the invention. Although the present invention has been disclosed in terms of preferred embodiments, the invention is not limited thereto, and its scope is to be defined by the appended claims and their equivalents.

What is claimed is:

1. A method of forming a Hall effect sensor for a magnetic recording head comprising the steps of:
   providing a single crystal substrate having a chemically dissimilar single crystal film thereon;
   providing a ceramic substrate having a first magnetic pole piece of a selected thickness formed on a surface thereof;
   positioning the single crystal substrate and the ceramic substrate with the single crystal film and magnetic pole piece surfaces in an opposing relationship;
   bonding the positioned ceramic substrate to the single crystal film on the positioned single crystal substrate to form a laminated structure having a substantially uniform thin bond line;
   removing chemically the single crystal substrate from the single crystal film;
   forming a Hall effect pattern in the film while one surface of the film is exposed; and
   depositing a second magnetic ole piece on the formed Hall effect pattern.

2. The method according to claim 1, wherein the step of providing the single crystal substrate comprises the substep of:
   depositing a single crystal film on a single crystal substrate, said single crystal substrate being soluble in a selected chemical, said single crystal film being substantially insoluble in said selected chemical.

3. The method according to claim 2, wherein said single crystal film is InSb and said single crystal substrate is one of InP and AlGaAs/GaAs.

4. The method according to claim 1, wherein the step of bonding the positioned ceramic substrate to the single crystal film on the positioned single crystal substrate comprises the substeps of:
   applying an adhesive layer to one of said surfaces having the first magnetic pole piece and said single crystal film;
   squeezing the positioned substrates together with a force sufficient to remove excess adhesive between the opposing surfaces for forming a bond line of adhesive; and
   curing the adhesive for bonding the positioned substrates.

5. The method according to claim 4, wherein said adhesive is an epoxy.

6. The method according to claim 4, wherein said adhesive is selected from the group consisting of a low viscosity organic material, a low melting point glass, and low melting point metal, and a low melting point alloy.

7. The method according to claim 1, wherein the step of removing the single crystal substrate comprises the substep of:
   etching the single crystal substrate away with a selective etchant effective to dissolve the substrate without significantly dissolving the single crystal film.

8. The method according to claim 1, wherein the step of providing the ceramic substrate comprises the substep of forming a patterned magnetic pole piece on the surface of the ceramic substrate, and the step of forming the Hall effect pattern is performed after the step of removing the single crystal substrate from the single crystal film.

9. The method according to claim 1, wherein the step of forming the Hall effect pattern is performed prior to the step of bonding the positioned ceramic substrate to the single crystal film on the positioned single crystal substrate.

10. A method of forming a Hall effect sensor for a magnetic recording head comprising the steps of:
   providing a single crystal substrate having a chemically dissimilar single crystal film thereon;
   providing a ceramic substrate having a first magnetic pole piece of a selected thickness formed on a surface thereof;
   positioning the single crystal substrate and the ceramic substrate with the single crystal film and magnetic pole piece surfaces in an opposing relationship;
   bonding the positioned ceramic substrate to the single crystal film on the positioned single crystal substrate to form a laminated structure having a substantially uniform thin bond line;
   removing chemically the single crystal substrate from the single crystal film;
   forming a Hall effect pattern in the film by ion milling with a photoresist pattern while one surface of the film is exposed; and
   depositing a second magnetic pole piece on the formed Hall effect pattern.

* * * * *